(12) United States Patent
Jia (10) Patent No.: US 8,109,767 B2
(45) Date of Patent: Feb. 7, 2012

(54) ELECTRICAL CONNECTOR

(75) Inventor: Chang-Hui Jia, Keelung (TW)

(73) Assignee: Lotes Co., Ltd., Keelung (TW)

( * ) Notice: Subject to any disclaimer, the term of this patent is extended or adjusted under 35 U.S.C. 154(b) by 206 days.

(21) Appl. No.: 12/690,248

(22) Filed: Jan. 20, 2010

(65) Prior Publication Data

US 2011/0177700 A1   Jul. 21, 2011

(51) Int. Cl.
*H01R 12/00* (2006.01)
(52) U.S. Cl. ........................................................ 439/65
(58) Field of Classification Search .................... 439/65, 439/67, 83, 660, 581, 695
See application file for complete search history.

(56) References Cited

U.S. PATENT DOCUMENTS

| | | | | |
|---|---|---|---|---|
| 4,781,600 A | * | 11/1988 | Sugiyama et al. | 439/45 |
| 5,400,003 A | * | 3/1995 | Kledzik | 333/247 |
| 5,515,241 A | * | 5/1996 | Werther | 361/784 |
| 5,632,630 A | * | 5/1997 | Card et al. | 439/79 |
| 5,973,928 A | * | 10/1999 | Blasi et al. | 361/760 |
| 6,520,802 B1 | * | 2/2003 | Mitra | 439/607.01 |
| 7,021,945 B2 | * | 4/2006 | Perugini et al. | 439/74 |
| 7,351,071 B2 | * | 4/2008 | Korsunsky et al. | 439/74 |
| 2009/0197436 A1 | * | 8/2009 | Trobough | 439/67 |

* cited by examiner

*Primary Examiner* — Jean F Duverne
(74) *Attorney, Agent, or Firm* — Rosenberg, Klein & Lee (57) ABSTRACT

An electrical connector is disclosed and includes a body and a cover. The body has a first through hole and an area for conducting and accommodating solder between the first through hole and the edges of the body. The cover is movably disposed on the body. The color of the cover is lighter than that of the body. The cover has a second through hole and an area for accommodating pins between the second through hole and the edges of the cover. The second through hole corresponds to the first through hole. The second through hole has a first rim, a second rim, a third rim, and a fourth rim. The third rim and the fourth rim are parallel to a movement direction of the cover. When the cover is at an open state on the body, the area for accommodating pins and the area for conducting and accommodating solder are disengaged, the projection of the first rim and the second rim of the second through hole vertically on the body does not lie in the first through hole. It solves the problem of making mistakes in inspection.

8 Claims, 8 Drawing Sheets

ELECTRICAL CONNECTOR

BACKGROUND OF THE INVENTION

1. Field of the Invention

This invention relates to an electrical connector, and more particularly, relates to an electrical connector for holding a chip module to connect the chip module to a circuit board.

2. Description of the Prior Art

Figure 1:
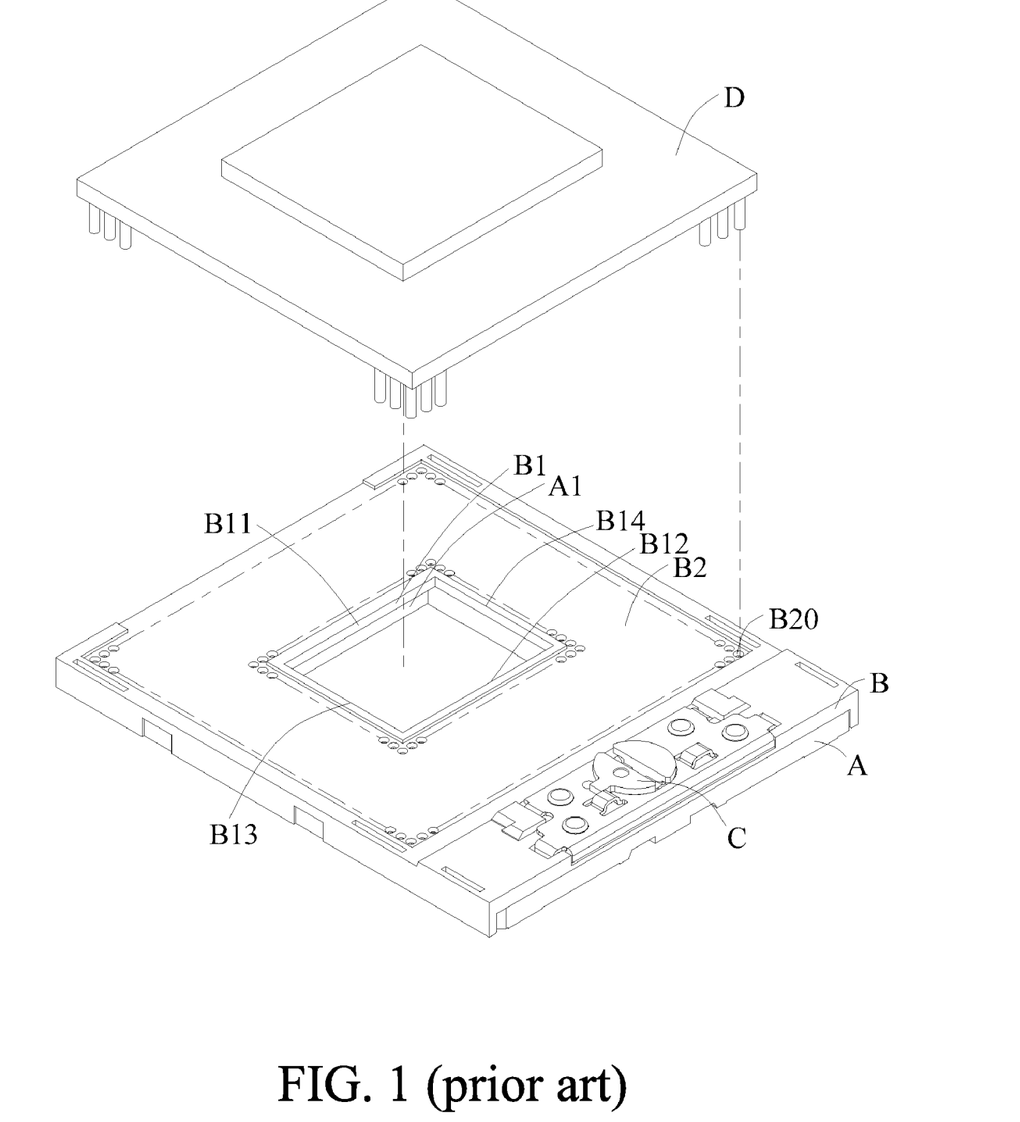
FIG. 1 is a schematic drawing of an electrical connector assembled in the prior art.
Figure 2:
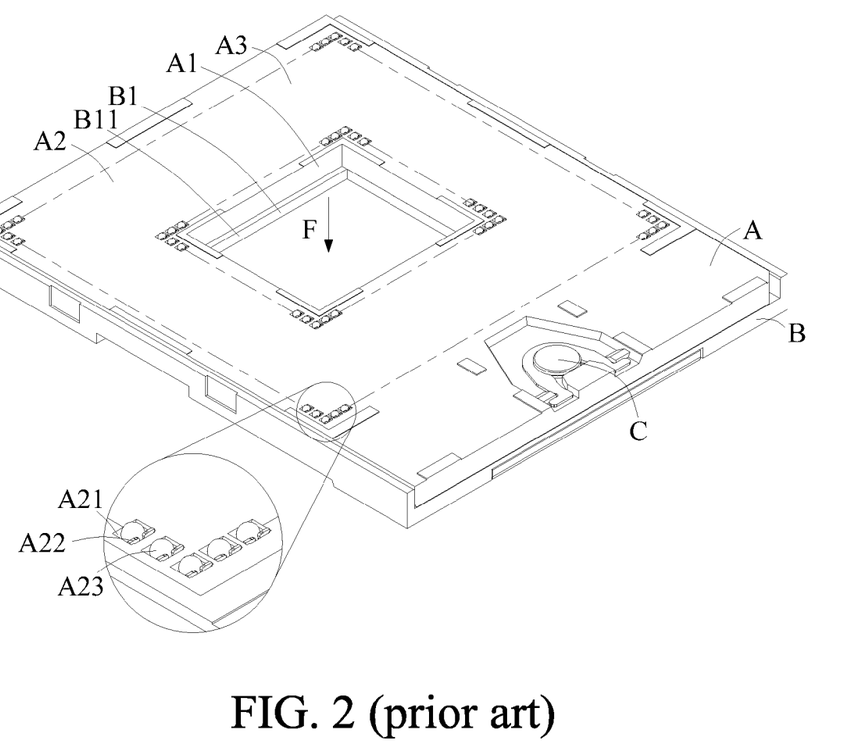
FIG. 2 is a drawing of the electrical connector with an opposite view relative to FIG. 1.
Figure 3:
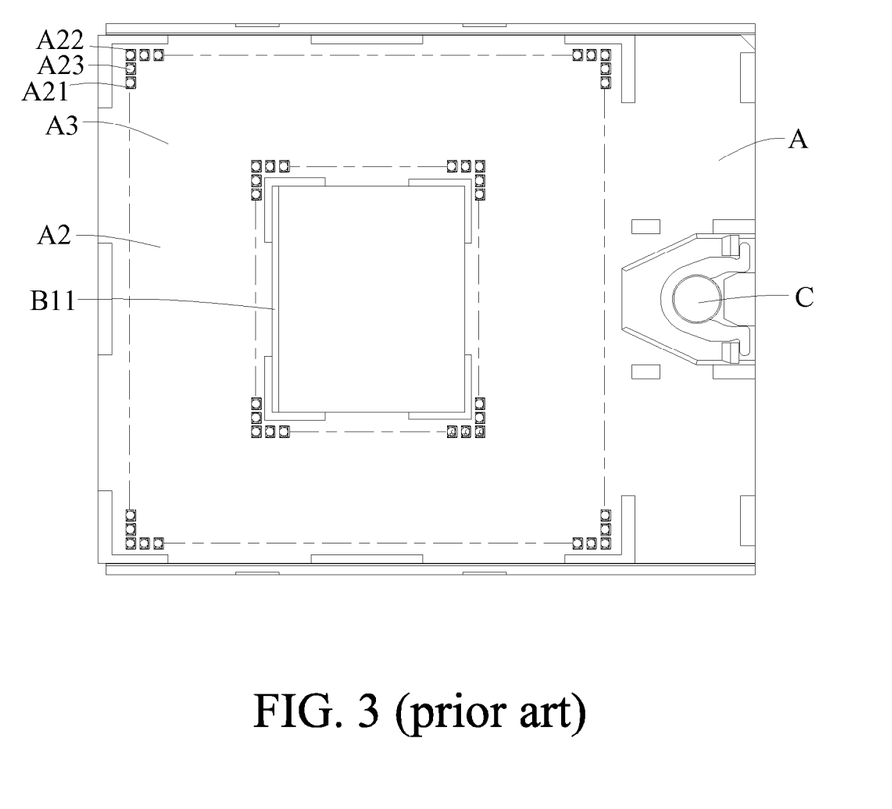
FIG. 3 is a top view of the electrical connector in FIG. 2.

As shown in FIGS. 1 through 3, an electrical connector for holding a chip module D to connect the chip module D to a circuit board in the prior art includes a body A, a cover B on the body A, and a driving device C for driving the cover B to move on the body A.

The body A has a first rectangle hole A1 and an area A2 for conducting and accommodating solder between the first rectangle hole A1 and the edges of the body A. A plurality of terminal holes A21 are formed at the area A2 for conducting and accommodating solder. Each of the terminal holes A21 accommodates a terminal A22 and a tin ball A23. The tin ball A23 is exposed out of the bottom surface A3 of the body A.

The cover B is used for holding the chip module D. The cover B has a second rectangle hole B1 corresponding to the first rectangle hole A1 and an area B2 for accommodating pins between the second rectangle hole B1 and the edges of the cover B. A plurality of pin holes B20 are formed at the area B2 for accommodating pins.

After the electrical connector is assembled completely, the cover B could move on the body A under the driving by the driving device C. The pin holes B20 at the area B2 for accommodating pins correspond to the terminal holes A21 at the area A2 for conducting and accommodating solder one to one. The second rectangle hole B1 lies above and communicates with the first rectangle hole A1, for accommodating a corresponding structure on a circuit board. The second rectangle hole B1 has a first rim B11 and a second rim B12 parallel to each other and a third rim B13 and a fourth rim B14 parallel to each other. The four rims protrude upwards from the surface of the area B2 for accommodating pins, which acts the function of supporting the chip module D. In view of a symmetric structure bringing a uniform supporting force, the second rectangle hole B1 is usually designed to be a square hole and the center thereof lies at the center of the area B2 for accommodating pins. Thereby, the four rims could uniformly bear the loading force by the chip module D so as to avoid the warping due to non-uniform loading.

After being assembled completely, the electrical connector needs to be inspected through CCD for confirming whether the product is qualified. Before the electrical connector is inspected, the driving device C is rotated to be at an open state. The cover B moves toward the driving device C and then stops. The area B2 for accommodating pins and the area A2 for conducting and accommodating solder are therefore disengaged. The conducting circuit is at an open state. By the view from the bottom surface A3 of the body A along the direction F (vertical direction), the first rim B11 of the second rectangle hole B1 is exposed out of the corresponding edge of the body A to be a visible state (as shown in FIG. 2 and FIG. 3). In the inspection, the tin ball surface (i.e. the bottom surface A3) of the body A is inspected with an inspection light source. The inspection light source irradiates the first rim B11 of the second rectangle hole B1 of the cover B whose color is lighter than that of the body A (for the requirement of the industry or the consideration of appearance, the cover B is usually designed to be lighter than the body A). The first rim B11 is misjudged possibly to be the tin balls A23; the mistake is therefore made.

Therefore, there is a requirement for designing a new electrical connector so as to solve the above disadvantage.

SUMMARY OF THE INVENTION

A purpose of the invention is to provide an electrical connector capable of avoiding making mistakes in inspection.

To achieve the above purpose, the electrical connector of the invention includes a body and a cover. The body has a first up-and-down through hole and an area for conducting and accommodating solder between the first through hole and the edges of the body. The cover is movably disposed on the body. The color of the cover is lighter than that of the body. The cover has a second up-and-down through hole and an area for accommodating pins between the second through hole and the edges of the cover. The second through hole corresponds to the first through hole. The area for accommodating pins corresponding to the area for conducting and accommodating solder. Furthermore, the second through hole has a first rim, a second rim, a third rim, and a fourth rim. The third rim and the fourth rim are parallel to the movement direction of the cover. When the cover is at an open state on the body, the area for accommodating pins and the area for conducting and accommodating solder are disengaged, a conducting circuit is at an open state, and the projection of the first rim and the second rim of the second through hole vertically on the body does not lie in the first through hole.

For the electrical connector of the invention, when the cover on the body is at the open state, the projection of the first rim and the second rim of the second through hole vertically on the body does not lie in the first through hole. Thereby, when the electrical connector is inspected through CCD, the inspection light source cannot irradiate the cover so as to avoid misjudging the cover whose color is lighter than the body to be the tin balls, and the problem of making mistakes in inspection is solved. Furthermore, because the third rim and the fourth rim are parallel to the movement direction of the cover, and the central line of the third rim and the fourth rim and the center line of the area for accommodating pins at the movement direction overlap, so just the third rim and the fourth rim could perform the uniform holding function when the cover holds the chip module.

The advantage and spirit of the invention may be understood by the following recitations together with the appended drawings.

DETAILED DESCRIPTION OF THE INVENTION

Please refer to FIGS. 4 through 8. The electrical connector of the embodiment according to the invention includes a body 1, a cover 2 disposed on the body 1, and a driving device 3 disposed on the body 1 and the cover 2. The cover 2 is used for holding a chip module 4.

Figure 4:
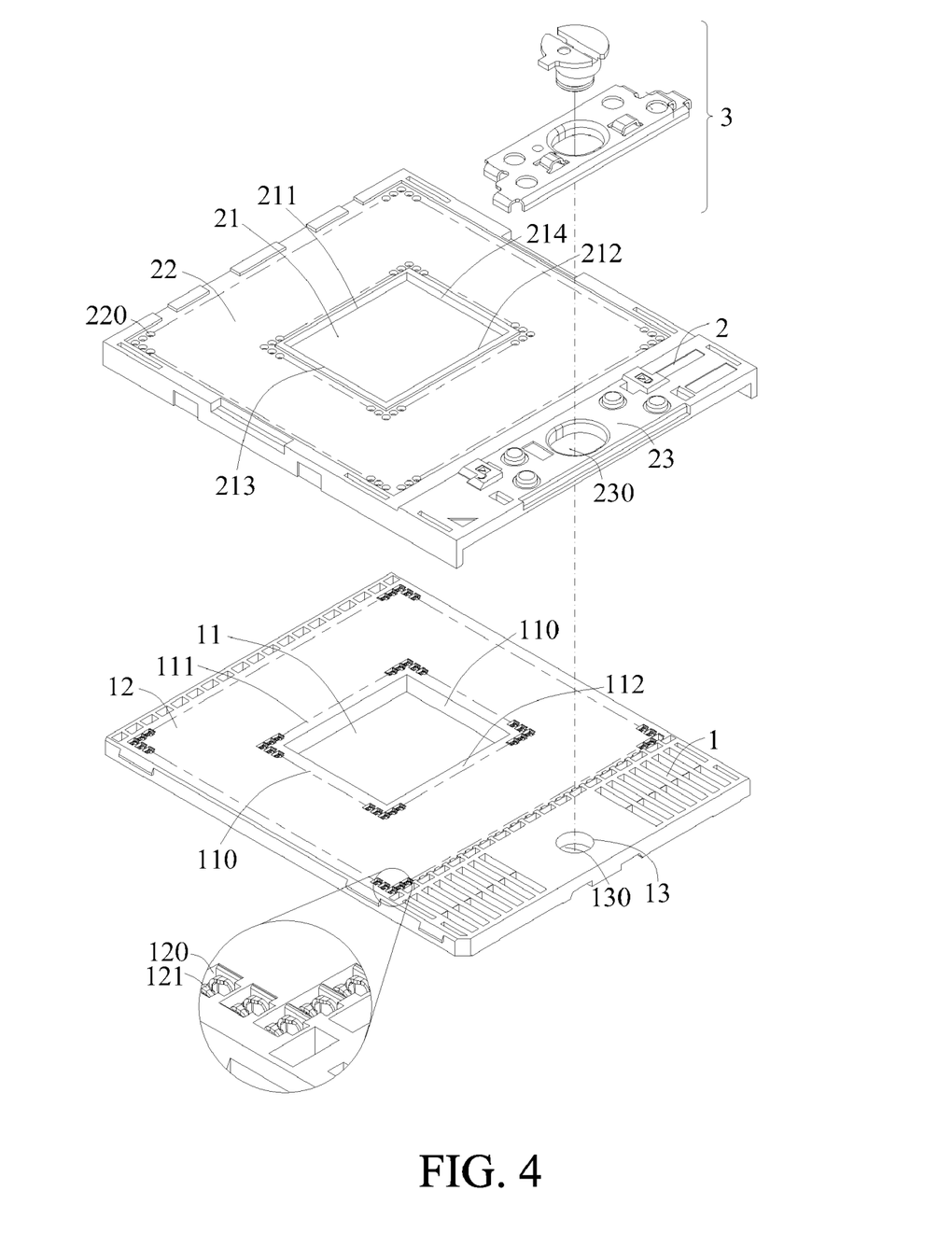
FIG. 4 is an exploded drawing of an electrical connector according to the invention.
Figure 5:
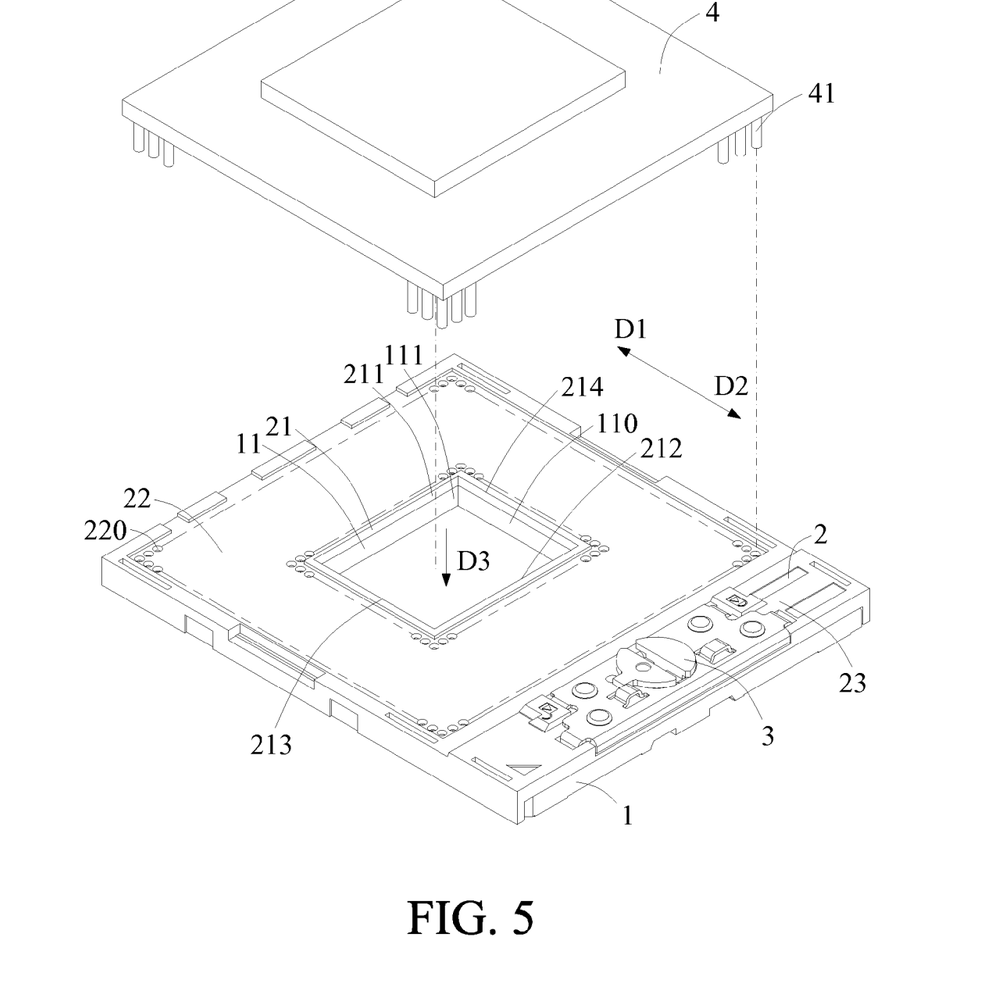
FIG. 5 is a schematic drawing of the electrical connector assembled according to the invention.
Figure 6:
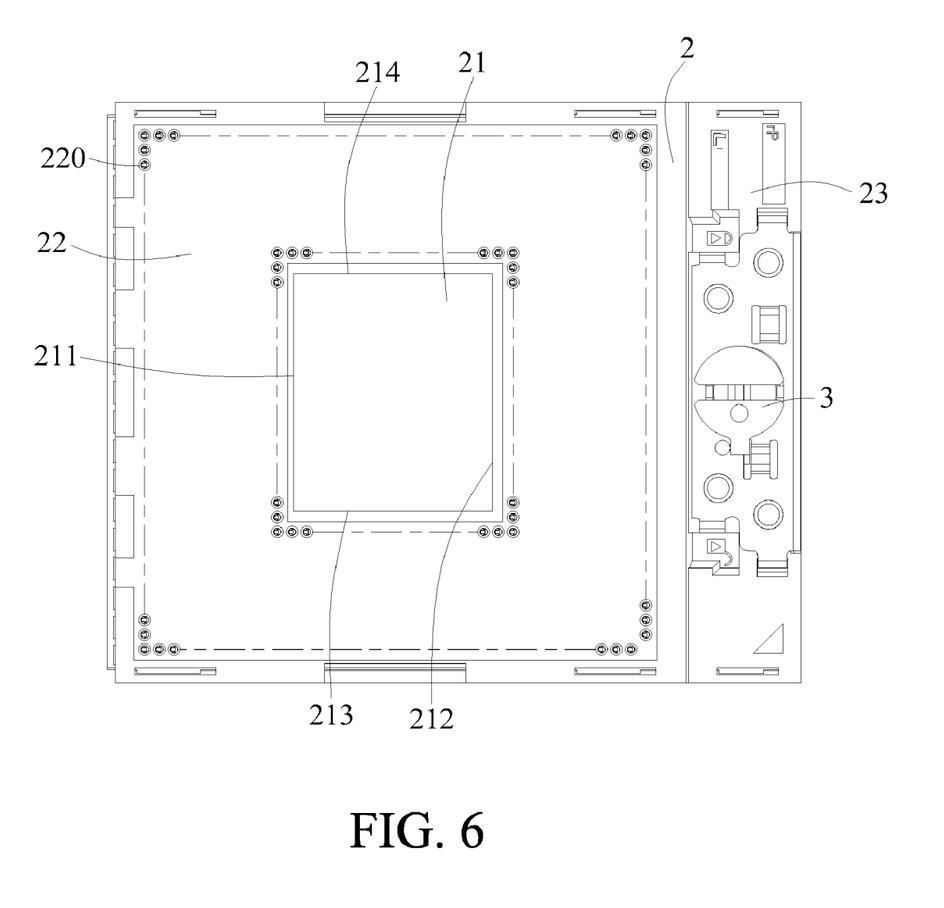
FIG. 6 is a top view of the electrical connector in FIG. 5.
Figure 7:
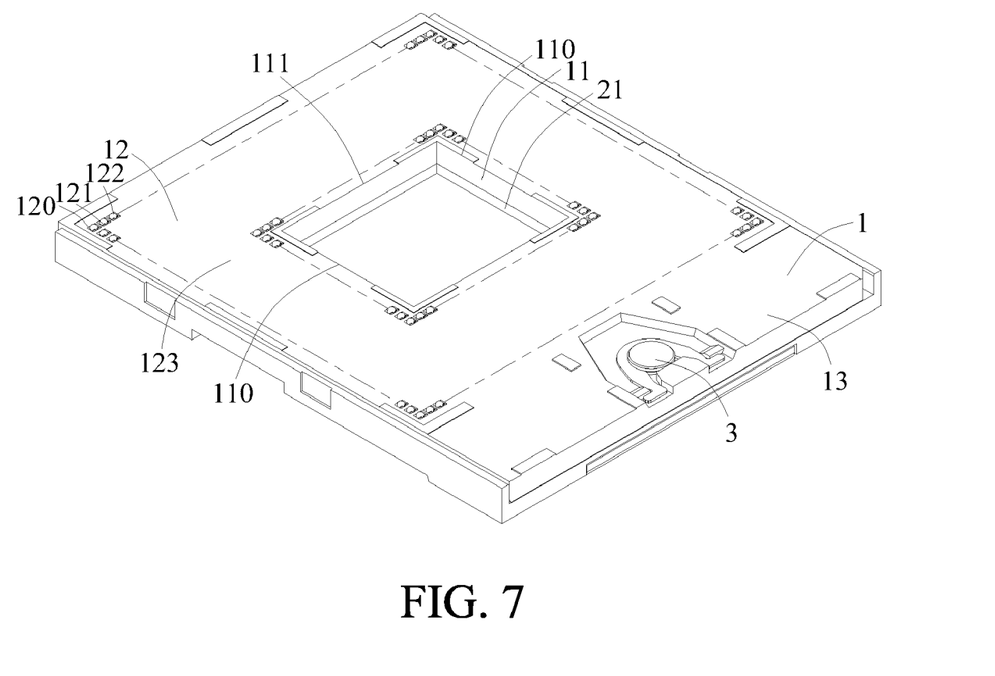
FIG. 7 is a drawing of the electrical connector with an opposite view relative to FIG. 5.
Figure 8:
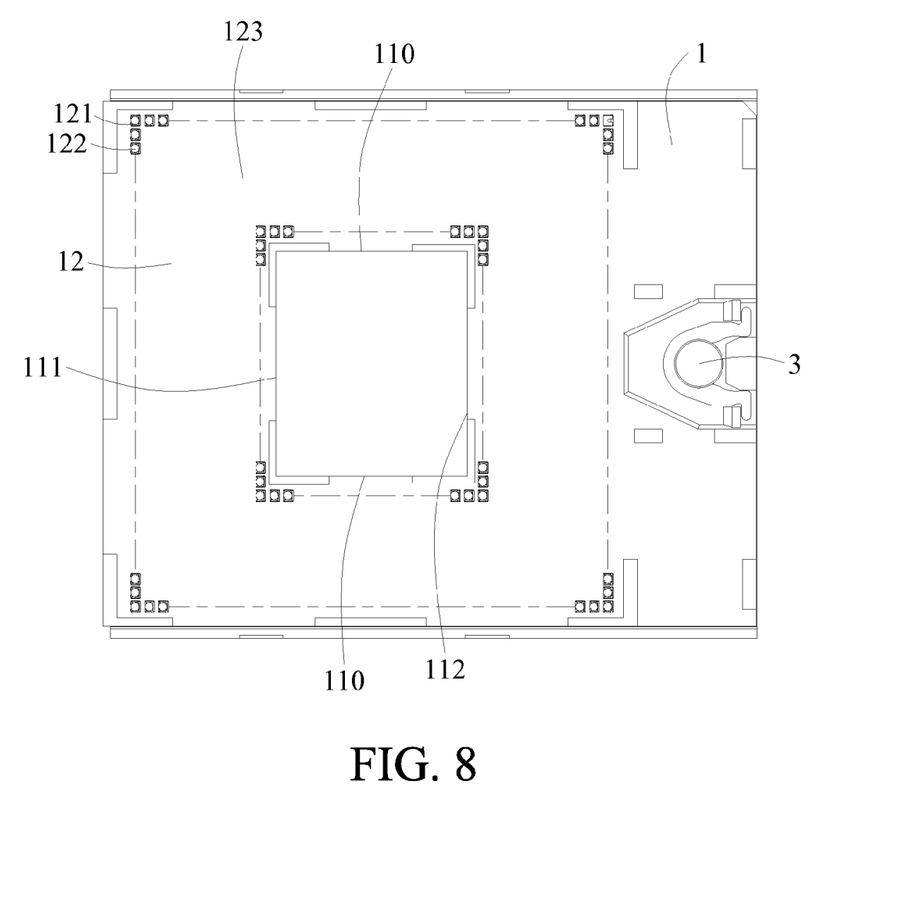
FIG. 8 is a top view of the electrical connector in FIG. 7.

The body 1 is rectangular and has a first rectangle hole 11, an area 12 for conducting and accommodating solder between the first rectangle hole 11 and the edges of the body 1, and an area 13 for accommodating driving device at a side of the area 12 for conducting and accommodating solder. The body 1 has a plurality of accommodating holes 120 at the area 12 for conducting and accommodating solder. Each of the accommodating holes 120 accommodates a conductive terminal 121 and a tin ball 122. The tin balls 122 are exposed out of the bottom surface 123 of the body 1. The center of the first rectangle hole 11 lies at the center of the area 12 for conducting and accommodating solder. The first rectangle hole 11 has two longitudinal rims 110 parallel to the movement direction of the cover 2 and a first transversal rim 111 and a second transversal rim 112 perpendicular to the movement direction of the cover 2. The body 1 has a first through hole 130 at the area 13 for accommodating driving device for accommodating the driving device 3.

The cover 2 is movably disposed on the body 1. The color of the cover 2 is lighter than that of the body 1. The cover 2 is rectangular and has a second rectangle hole 21 corresponding to the first rectangle hole 11 and an area 22 for accommodating pins between the second rectangle hole 21 and the edges of the cover 2 corresponding to the area 12 for conducting and accommodating solder. The cover 2 has a plurality of pin holes 220 at the area 22 for accommodating pins. Each of the pin holes 220 corresponds to one of the accommodating holes 120. The cover 2 has a driving area 23 at a side of the area 22 for accommodating pins correspondingly to the area 13 for accommodating the driving device 3. The cover 2 has a second through hole 230 at the driving area 23 correspondingly to the first through hole 130 for accommodating the driving device 3. The second rectangle hole 21 has a first rim 211 and a second rim 212 parallel to each other, and a third rim 213 and a fourth rim 214 parallel to each other. Therein, the third rim 213 and the fourth rim 214 are parallel to the movement direction of the cover 2. The third rim 213 and the fourth rim 214 are longer than the two longitudinal rims 110 in length and extends away from the driving device 3 relative to the two longitudinal rims 110, so that the center of the second rectangle hole 21 departs from the center of the area 22 for accommodating pins and away from the driving device 3.

The driving device 3 is a cam driving device and is disposed in the first through hole 130 of the body 1 and the second through hole 230 of the cover 2 for driving the cover 2 to move on the body 1.

After the electrical connector is assembled completely, the cover 2 could be driven by the driving device 3 to move along the directions D1 and D2 in the figures on the body 1. When the driving device 3 is driven to be at a close state, the cover 2 moves away from the driving device 3 (i.e. the direction D1) and then stops. The area 22 for accommodating pins of the cover 2 and the area 12 for conducting and accommodating solder are engaged. Each of the accommodating holes 120 and the corresponding pin hole 220 are aligned. At this moment, if the chip module 4 is disposed on the cover 2, the pins 41 of the chip module 4 is inserted into the pin holes 220 and also into the corresponding accommodating holes 120 correspondingly so as to electrically contact the conductive terminals 121 in the accommodating holes 120.

Please refer to FIGS. 5 through 8. For the inspection, when the driving device 3 is driven to be at an open state, the cover 2 moves toward the driving device 3 (i.e. the direction D2) and then stops. The area 22 for accommodating pins of the cover 2 and the area 12 for conducting and accommodating solder of the body 1 are therefore disengaged. The third rim 213 and the fourth rim 214 are longer than the two longitudinal rims 110 in length and extends away from the driving device 3 relative to the two longitudinal rims 110 (i.e. the direction D1) so that the center of the second rectangle hole 21 departs from the center of the area 22 for accommodating pins and away from the driving device 3, so when the cover 2 moves toward the driving device 3 and then stops, the projection of the first rim 211 and the second rim 212 of the second rectangle hole 21 vertically on the body 1 (i.e. the direction D3) does not lie in the first rectangle hole 11. That is, by the view from and vertical to the surface of the body 1 where the tin balls 122 are disposed, the first rim 211 and the second rim 212 are hidden by the body 1 to be an invisible state. Thereby, when the inspection light source irradiates the bottom surface 123 of the body 1 where the tin balls 122 lie, the cover 2 is not irradiated. Therefore, it is avoided that misjudging the cover 2 to be the tin balls 122 by the inspection light source results in mistakes in the inspection.

In other embodiments, the center of the second rectangle hole 21 lies at the center of the area 22 for accommodating pins, while the center of the first rectangle hole 11 departs from the center of the area 12 for conducting and accommodating solder and toward the driving device 3 at the movement direction of the cover 2. Or the center of the first rectangle hole 11 departs from the center of the area 12 for conducting and accommodating solder and toward the driving device 3 at the movement direction of the cover 2, while the center of the second rectangle hole 21 departs from the center of the area 22 for accommodating pins and away from the driving device 3 at the movement direction of the cover 2. Thereby, any configuration is acceptable as long as the driving device 3 is driven to be the open state, and the projection of the first rim 211 and the second rim 212 of the second rectangle hole 21 vertically on the body 1 does not lie in the first rectangle hole 11, so as to avoid the problem of misjudging the cover 2 to be the tin balls 122 when the inspection light source irradiates the cover 2.

Certainly, in other embodiments, it is not necessary for the body 1 and the cover 2 to have the first rectangle hole 11 and the second rectangle hole 21 of the embodiment; they could be other kinds of through hole.

With the example and explanations above, the features and spirits of the invention will be hopefully well described. Those skilled in the art will readily observe that numerous modifications and alterations of the device may be made while retaining the features and spirit of the invention. Accordingly, the above disclosure should be construed as limited only by the metes and bounds of the appended claims.

What is claimed is:

1. An electrical connector, comprising:
  a body, having a first up-and-down through hole and an area for conducting and accommodating solder between the first through hole and the edges of the body; and
  a cover, movably disposed on the body, the color of the cover being lighter than that of the body, the cover having a second up-and-down through hole and an area for accommodating pins between the second through hole and the edges of the cover, the second through hole corresponding to the first through hole, the area for accommodating pins corresponding to the area for conducting and accommodating solder, wherein the second through hole has a first rim, a second rim, a third rim, and a fourth rim, the third rim and the fourth rim are parallel to the movement direction of the cover, and when the cover is at an open state on the body, the area for accommodating pins and the area for conducting and accommodating solder are disengaged, a conducting circuit is at an open state, and the projection of the first rim and the second rim of the second through hole vertically on the body does not lie in the first through hole.

2. The electrical connector of claim 1, wherein the first through hole and the second through hole respectively are rectangle holes.

3. The electrical connector of claim 2, wherein the body has an area for accommodating driving device at a side of the area for conducting and accommodating solder, the cover has a driving area at a side of the area for accommodating pins correspondingly to the area for accommodating driving device, a driving device driving the cover to move on the body is disposed at the area for accommodating driving device and the driving area, and a distance from the first rim of the second through hole to the driving device is longer than the distance from the second rim of the second through hole to the driving device.

4. The electrical connector of claim 3, wherein a center of the first through hole lies at a center of the area for conducting and accommodating solder, and a center of the second through hole departs from a center of the area for accommodating pins and away from the driving device at the movement direction of the cover, so that the projection of the first rim vertically on the body does not lie in the first through hole.

5. The electrical connector of claim 3, wherein a center of the second through hole lies at a center of the area for accommodating pins, and a center of the first through hole departs from a center of the area for conducting and accommodating solder and toward the driving device at the movement direction of the cover, so that the projection of the first rim vertically on the body does not lie in the first through hole.

6. The electrical connector of claim 3, wherein a center of the first through hole departs from a center of the area for conducting and accommodating solder and toward the driving device at the movement direction of the cover, and a center of the second through hole departs from a center of the area for accommodating pins and away from the driving device at the movement direction of the cover, so that the projection of the first rim vertically on the body does not lie in the first through hole.

7. The electrical connector of claim 3, wherein the driving device is a cam driving device.

8. The electrical connector of claim 1, wherein the body has a plurality of up-and-down accommodating holes at the area for conducting and accommodating solder, each of the accommodating holes accommodates a tin ball and a conductive terminal, the cover has a plurality of pin holes penetrating the cover at the area for accommodating pins, and each of the pin holes corresponds to one of the accommodating holes.

* * * * *